United States Patent [19]

Hayashi

[11] Patent Number: 5,708,667
[45] Date of Patent: Jan. 13, 1998

[54] METHOD FOR DETECTING AND CORRECTING ERROR BY MEANS OF A HIGH-DIMENSION MATRIX AND DEVICE USING THE SAME

[75] Inventor: Tomohiro Hayashi, Yokohama, Japan

[73] Assignee: Fujitsu Limited, Kawasaki, Japan

[21] Appl. No.: 781,138

[22] Filed: Jan. 9, 1997

Related U.S. Application Data

[63] Continuation of Ser. No. 279,391, Jul. 25, 1994, abandoned.

[30] Foreign Application Priority Data

Aug. 10, 1993 [JP] Japan .................................. 5-198204

[51] Int. Cl.[6] .................................................. H03M 13/00
[52] U.S. Cl. .................................................. 371/37.4
[58] Field of Search .................................................. 371/37.4

[56] References Cited

U.S. PATENT DOCUMENTS

| | | | |
|---|---|---|---|
| 4,277,844 | 7/1981 | Hancock et al. | 371/40.1 |
| 4,564,945 | 1/1986 | Glover et al. | 371/40.1 |
| 4,603,348 | 7/1986 | Yamada et al. | 358/500 |
| 4,667,308 | 5/1987 | Hayes et al. | 365/230.02 |
| 4,670,881 | 6/1987 | Imoto | 371/37.1 |
| 4,796,260 | 1/1989 | Schilling et al. | 371/37.4 |

*Primary Examiner*—Stephen M. Baker
*Attorney, Agent, or Firm*—Staas & Halsey

[57] ABSTRACT

A method of detecting and correcting an error which may be contained in digital data includes steps of (a) arranging the digital data in a plurality of dimensions equal to or higher than a fourth dimension so that arranged data is obtained for each of the plurality of dimensions, (b) producing error detection and correction data for the arranged data obtained for each of the plurality of dimensions, and (c) detecting and correcting an error which may be contained in the digital data by using the error detection and correction data.

17 Claims, 9 Drawing Sheets

```
                    ┌─ 100
                    │
         ┌─────┐ 103
         │SRAM │
         └──┬──┘
            │        ┌───┐ 104
            │   101  │OSC│
            │  ┌─────┤   │
            │  │     └───┘
  HOST ←──→ │CONTROLLER├────────────────────────────┐
            │  LSI     │                            │
            └──┬──┬────┴──┬──────┬──────┬──────┬────┤
               │  │102    ↓      ↓      ↓      ↓    ↓
               │ ┌──┐  ┌─────┐┌─────┐┌─────┐┌─────┐┌─────┐
               └─┤CPU│ │FLASH││FLASH││FLASH││FLASH││FLASH│
                 └──┘  └──┬──┘└──┬──┘└──┬──┘└──┬──┘└──┬──┘
                       105-1 105-2  105-3  105-4  105-5
```

FIG. 3

| | 007 | 008 | 005 | 004 | 003 | 002 | 001 | 000 bit |
|---|---|---|---|---|---|---|---|---|
| 000 | AA7 | AA6 | AA5 | AA4 | AA3 | AA2 | AA1 | AA0 |
| 001 | AB7 | AB6 | AB5 | AB4 | AB3 | AB2 | AB1 | AB0 |
| 002 | AC7 | AC6 | AC5 | AC4 | AC3 | AC2 | AC1 | AC0 |
| 003 | AD7 | AD6 | AD5 | AD4 | AD3 | AD2 | AD1 | AD0 |
| 004 | AE7 | AE6 | AE5 | AE4 | AE3 | AE2 | AE1 | AE0 |
| 005 | AF7 | AF6 | AF5 | AF4 | AF3 | AF2 | AF1 | AF0 |
| 006 | AG7 | AG6 | AG5 | AG4 | AG3 | AG2 | AG1 | AG0 |
| 007 | AH7 | AH6 | AH5 | AH4 | AH3 | AH2 | AH1 | AH0 |
| 008 | BA7 | BA6 | BA5 | BA4 | BA3 | BA2 | BA1 | BA0 |
| 009 | BB7 | BB6 | BB5 | BB4 | BB3 | BB2 | BB1 | BB0 |
| ⋮ | ⋮ | ⋮ | ⋮ | ⋮ | ⋮ | ⋮ | ⋮ | ⋮ |
| 511 | HH7 | HH6 | HH5 | HH4 | HH3 | HH2 | HH1 | HH0 | line

FIG. 4A

| AA7 | AA6 | AA5 | AA4 | AA3 | AA2 | AA1 | AA0 |
|---|---|---|---|---|---|---|---|
| AB7 | AB6 | AB5 | AB4 | AB3 | AB2 | AB1 | AB0 |

⇩

| AA2 | AA0 |
|---|---|
| AA3 | AA1 |

| AA6 | AA4 |
|---|---|
| AA7 | AA5 |

| AB2 | AB0 |
|---|---|
| AB3 | AB1 |

| AB6 | AB4 |
|---|---|
| AB7 | AB5 |

. . . .

| HH6 | HH4 |
|---|---|
| HH7 | HH5 |

FIG. 4B

| AA7 | AA6 |
|---|---|
| AB7 | AB6 |
| AC7 | AC6 |
| AD7 | AD6 |
| AE7 | AE6 |
| AF7 | AF6 |

⇩

| AC0 | AA0 |
|---|---|
| AD0 | AB0 |

| AC1 | AA1 |
|---|---|
| AD1 | AB1 |

| AC2 | AA2 |
|---|---|
| AD2 | AB2 |

| AC3 | AA3 |
|---|---|
| AD3 | AB3 |

. . . . .

| HG7 | HE7 |
|---|---|
| HH7 | HF7 |

FIG. 5

| AA7 | AA6 | AA5 | AA4 | AA3 | AA2 | AA1 | AA0 |
|---|---|---|---|---|---|---|---|
| AB7 | AB6 | AB5 | AB4 | AB3 | AB2 | AB1 | AB0 |

⇩

| AC2 | AA0 |
|---|---|
| AD3 | AB1 |

| AC3 | AA1 |
|---|---|
| AD4 | AB2 |

| AC4 | AA2 |
|---|---|
| AD5 | AB3 |

| AC5 | AA3 |
|---|---|
| AD6 | AB4 |

. . . .

| HH6 | HE4 |
|---|---|
| HH7 | HF5 |

| | |
|---|---|
| PS00 : xxxxxxxx0 | 3RD DIMENSION |
| PS01 : xxxxxxxx1 | |
| PS02 : xxxxxxx0x | 4TH DIMENSION |
| PS03 : xxxxxxx1x | |
| PS04 : xxxxxx0xx | 5TH DIMENSION |
| PS05 : xxxxxx1xx | |
| PS06 : xxxxx0xxx | 6TH DIMENSION |
| PS06 : xxxxx1xxx | |
| ⋮ | ⋮ |
| PS18 : 0xxxxxxxx | 12TH DIMENSION |
| PS19 : 1xxxxxxxx | |

FIG. 8

| line \ bit | 007 | 006 | 005 | 004 | 003 | 002 | 001 | 000 |
|---|---|---|---|---|---|---|---|---|
| 000 | AA7 | AA6 | AA5 | AA4 | AA3 | AA2 | AA1 | AA0 |
| 001 | AB7 | AB6 | AB5 | AB4 | AB3 | AB2 | AB1 | AB0 |
| 002 | AC7 | AC6 | AC5 | AC4 | AC3 | AC2 | AC1 | AC0 |
| 003 | AD7 | AD6 | AD5 | AD4 | AD3 | AD2 | AD1 | AD0 |
| 004 | AE7 | AE6 | AE5 | AE4 | AE3 | AE2 | AE1 | AE0 |
| 005 | AF7 | AF6 | AF5 | AF4 | AF3 | AF2 | AF1 | AF0 |
| 006 | AG7 | AG6 | AG5 | AG4 | AG3 | AG2 | AG1 | AG0 |
| 007 | AH7 | AH6 | AH5 | AH4 | AH3 | AH2 | AH1 | AH0 |
| 008 | BA7 | BA6 | BA5 | BA4 | BA3 | BA2 | BA1 | BA0 |
| 009 | BB7 | BB6 | BB5 | BB4 | BB3 | BB2 | BB1 | BB0 |
| ⋮ | ⋮ | ⋮ | ⋮ | ⋮ | ⋮ | ⋮ | ⋮ | ⋮ |
| 511 | HH7 | HH6 | HH5 | HH4 | HH3 | HH2 | HH1 | HH0 |
| 512 | PS09 | PS08 | PS07 | PS06 | PS05 | PS04 | PS03 | PS02 |
| 513 | PS17 | PS16 | PS15 | PS14 | PS13 | PS12 | PS11 | PS10 |
| 514 | PS01 | PS00 | CP1 | CP0 | LP1 | LP0 | PS19 | PS18 |

FIG. 9

| | | | | | | | | |
|---|---|---|---|---|---|---|---|---|
| 512 | PS09 | PS08 | PS07 | PS06 | PS05 | PS04 | PS03 | PS02 |
| 513 | PS17 | PS16 | PS15 | PS14 | PS13 | PS12 | PS11 | PS10 |
| 514 | PS01 | PS00 | CP1 | CP0 | LP1 | LP0 | PS19 | PS18 |

FIG.10

| PRESENCE /NON-PRESENCE OF CHECK SUM ERROR | PRESENCE/NON-PRESENCE OF PARITY DATA ERROR | | |
|---|---|---|---|
| | [1] | [2] | [3] |
| PRESENCE | ERROR IN DATA PART | ERROR IN DATA PART | ERROR IN CHECK SUM DATA |
| NON-PRESENCE | ERROR IN DATA PART | ERROR IN PARITY DATA | NORMAL |

FIG.12C

METHOD FOR DETECTING AND CORRECTING ERROR BY MEANS OF A HIGH-DIMENSION MATRIX AND DEVICE USING THE SAME

This application is a continuation of application Ser. No. 08/279,391, filed Jul. 25, 1994, now abandoned.

BACKGROUND OF THE INVENTION

1. Field of the Invention

The present invention generally relates to a method for detecting and correcting an error contained in digital data. More particularly, the present invention is concerned with a method for detecting and correcting an error contained in digital data by means of a high-dimension matrix.

2. Description of the Prior Art

A method is known for detecting and correcting an error contained in digital data of which the structure of a frame, which is the unit of transmission of digital data, is designed to have a three-dimensional arrangement. Check data for detecting an error in data is added to the data arranged in the frame. Further, parity data for correcting the error is added to the data in the frame in each of the directions of the three dimensions.

The method for making the frame structure having the three-dimensional arrangement and producing the parity data with respect to the three-dimensional arrangement has an advantage in that a plurality of bit errors can be corrected, while having a disadvantage in that a large amount of data must be added to the data in the frame for error correction. Hence, the above conventional method needs a large memory capacity and a large amount of processing for generating the parity data.

SUMMARY OF THE INVENTION

It is a general object of the present invention to provide a method for detecting and correcting an error in digital data in which the above disadvantage is eliminated.

A more specific object of the present invention is to provide a method for detecting and correcting an error in digital data by means of a high-dimension matrix using a small amount of error detection and correction data to be added to original data, so that a one-bit error can be detected and corrected and a plural-bit error can be detected.

The above objects of the present invention are achieved by a method of detecting and correcting an error which may be contained in digital data, the method comprising the steps of:

(a) arranging the digital data in a plurality of dimensions equal to or higher than a fourth dimension so that arranged data is obtained for each of the plurality of dimensions;

(b) producing error detection and correction data for the arranged data obtained for each of the plurality of dimensions; and (c) detecting and correcting an error which may be contained in the digital data by using the error detection and correction data.

Preferably, the step (a) comprises the step of arranging bits of the digital data in matrixes having a predetermined size; and the step (b) comprises the step of producing the error detection and correction data for the bits of the digital data arranged in the matrixes.

Preferably, the step (c) comprises the step of detecting and correcting an error which may be contained in the digital data by using the error detection and correction data and check sum data.

Preferably, the step (c) comprises the step of detecting and correcting a one-bit error which may be contained in the digital data by using the error detection and correction data.

Preferably, the step (c) comprises the step of detecting and correcting an odd error of a plurality of bits which may be contained in the digital data by using the error detection and correction data.

Preferably, the step (c) comprises the step of detecting and correcting an even error of the plurality of bits which may be contained in the digital data by using the error detection and correction data.

Preferably, the step (c) comprises the step of detecting and correcting an error which may be contained in the digital data by using the error detection and correction data and check sum data.

Preferably, the method further comprises:

(d) writing the digital data into a memory together with the error detection and correction data; and (e) reading digital data from the memory together with the error detection and correction data, the step (c) detecting and correcting an error which may be contained in the digital data by using the error detection and correction data read from the memory in the step (e).

Another object of the present invention is to provide a device using the above-mentioned method.

This object of the present invention is achieved by a device comprising: a memory; and control means for controlling a data write and read operation on the memory;

the control means comprising: first means for arranging digital data to be written into the memory in a plurality of dimensions equal to or higher than a fourth dimension so that arranged data is obtained for each of the plurality of dimensions; second means for producing error detection and correction data for the arranged data obtained for each of the plurality of dimensions; and third means for detecting and correcting an error which may be contained in the digital data by using the error detection and correction data.

BRIEF DESCRIPTION OF THE DRAWINGS

Other objects, features and advantages of the present invention will become more apparent from the following detailed description when read in conjunction with the accompanying drawings, in which.

DESCRIPTION OF THE PREFERRED EMBODIMENTS

Figure 1:
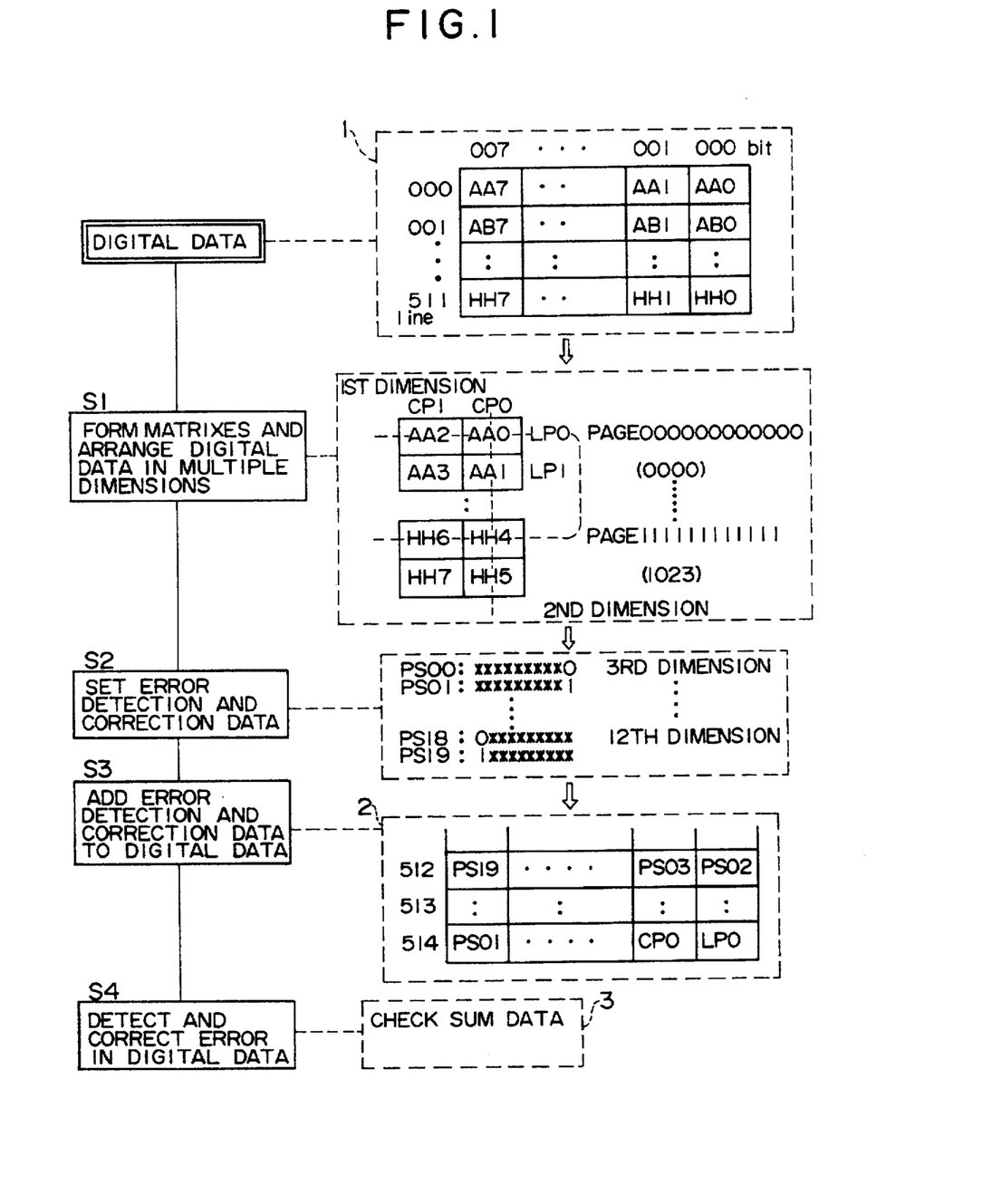
FIG. 1 is a diagram of the principle of the present invention.

FIG. 1 is a diagram of the principle of the present invention.

Digital data 1 has 512 lines, each of the lines consisting of eight pieces of data such as AA0-AA7. In step S1, a plurality of matrixes, each having some pieces of data, are produced from the digital data and are respectively handled as pages. That is, one of the matrixes forms one page. Each of the matrixes consists of four pieces of data, such as AA0, AA1, AA2 and AA3 arranged in columns and lines (rows), as shown in FIG. 1. The matrix consisting of the four pieces of data AA0, AA1, AA2 and AA3 is handled as page $(0000)_{10}$ in decimal notation (which corresponds to $(000000000000)_2$ in binary notation). Then, the pieces of data of the matrixes are grouped in first and second dimensions so as to form pieces of first-dimension data each consisting of the pieces of data located in the same line and pieces of second-dimension data each consisting of the pieces of data located in the same column. When 2×2 matrixes are used, two pieces of data are formed in the first dimensions and two pieces of data are formed in the second dimension. Each of the two pieces of first-dimension data consists of 2048 bits, and each of the two pieces of second-dimension data consists of 2048 bits.

Then in step S2 two pieces CP0 and CP1 of parity data (error detection and correction data) for the respective pieces of first-dimension data are produced, and two pieces LP0 and LP1 of parity data for the respective pieces of second-dimension data are produced. The parity data CP0 and CP1 are handled as first-dimension data, and the parity data LP0 and LP1 are handled as second-dimension data.

In step S2, dimension data having dimensions higher than the second dimension are produced from the pages. More specifically, two pieces of parity data for data "0" and "1" in each of the digits of the binary page numbers identifying the pages are calculated. For example, parity data PS00 for data (2048-bit data in the example shown in FIG. 1) of the pages having the first digit "0" in the page number expressed in binary notation is calculated, and parity data PS01 for data of the pages having the first digit "1" in the page number is calculated. The parity data PS00 and PS01 are handled as third-dimension data. Parity data PS02 for data of the pages having the second digit "0" of the page number is calculated, and parity data PS03 for data of the pages having the second digit "1" in the page number is calculated. The parity data PS02 and PS03 are handled as fourth-dimension data. In the above-mentioned manner, two pieces of parity data for data of the pages having the i-th digit "0" and data of the pages having the i-th digit "1" are calculated.

It is noted that in FIG. 1, the parity data related to the first and second dimensions is shown in the dashed box to the right of step S1 to aid in understanding how the first and second dimension parity data CP0, CP1, LP0, LP1 are produced. However, generally, the matrixes are produced and data of the matrixes are arranged in the multiple dimensions in step S1. Then, in step S2, a pair of pieces of parity data (parity bits) is calculated in each of the including the first and second dimension parity data CP0, CP1, LP0, LP1. It is preferable to arrange the digital data in dimensions equal to or higher than the fourth dimensions in order to detect and correct errors which may be contained in the digital data with high accuracy.

In step S3, a group 2 of parity data (error detection and correction data) is added to the digital data 1. In step S4, an error contained in the digital data 1 is detected and corrected by means of the group 2 of parity data. It is possible to additionally use sum check data 3 for the digital data 1 in order to detect and correct an error contained in the digital data 1. In step S4, a one-bit error can be detected and corrected by means of the group 2 of parity data. Further, a two-bit error and an odd-bit error consisting of three bits or more can be detected.

Figure 2:
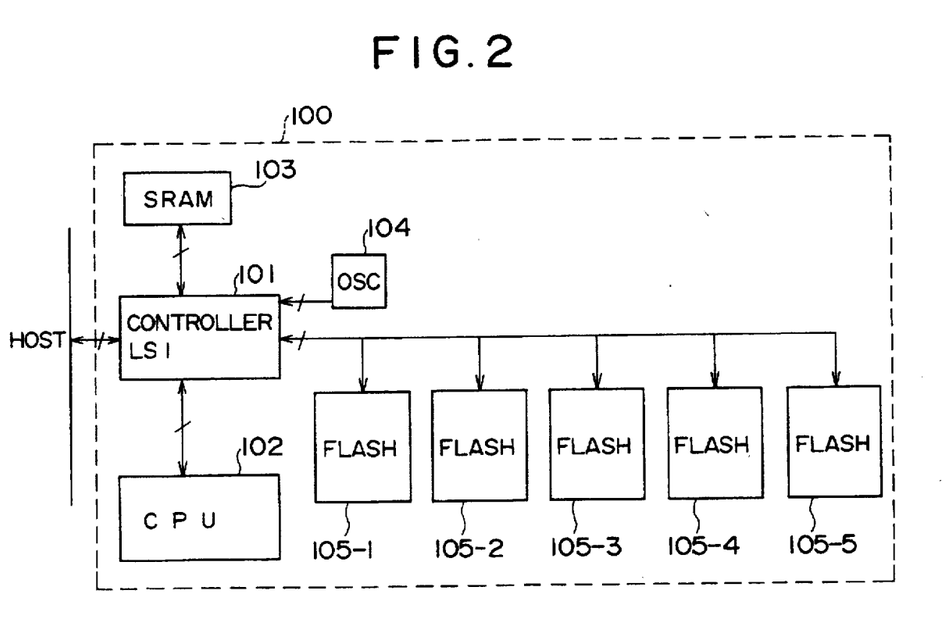
FIG. 2 is a block diagram of a memory device using the error detection and correction method of the present invention.

FIG. 2 is a block diagram of a memory system 100 which is an application of the present invention. The memory system 100 shown in FIG. 2 uses flash memories. More particularly, the memory system 100 includes a controller LSI 101, a CPU (Central Processing Unit) 102, an SRAM (Static Random Access Memory) 103, a clock generator 104, and flash memories 105-1 through 105-5. The memory system 100 is, for example, a memory card. The controller LSI 101 controls the data erasing and writing operations of the flash memories 105-1 through 105-5. The SRAM 103 is used to store various tables and is used as a data buffer for temporarily storing data and as a save buffer when writing data into the flash memories 105-1 through 105-5. The CPU 102 or the controller LSI 101 produces the error detection and correction data to be added to data to be written into the flash memories 105-1 through 105-5 when writing the data therein, and adds the data with the error detection and correction data added thereto into the flash memories 105-1 through 105-5. The CPU 102 or the controller LSI 101 performs the error detection and correction operation by means of the above-mentioned error detection and correction data.

Figure 3:
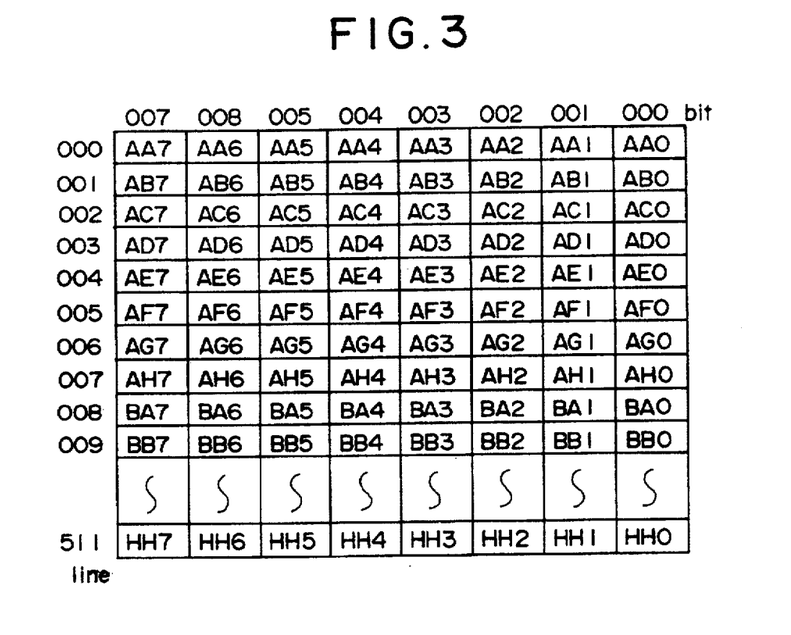
FIG. 3 is a diagram of an example of digital data processed by the present invention.

FIG. 3 shows data equal to one frame (512 bytes) to be written into the flash memories. A description will hereinafter be given of production of the error detection and correction data with respect to 512-byte data in order to facilitate understanding the embodiment of the present invention being considered. However, it is to be noted that the present invention is not limited to the 512-byte data.

The error detection and correction data is produced as follows.

First of all, matrixes are formed from the 512-byte data. The matrixes have a minimum unit making it easy to process data. An optimal minimum unit for facilitating data processing is the 2×2 matrix because normally the processing unit of digital data is $2^2$. However, the minimum unit may be the 2×3, 2×4, 4×4, 4×8 or 8×8 matrix, taking into account the amount of data to be processed. In the following description, the 2×2 matrix is used.

Next, four pieces of data of the digital data shown in FIG. 3 are set in the 2×2 matrix in one of the following four methods. Of course, another method can be used to set four pieces of data in the 2×2 matrix.

Figure 4A:
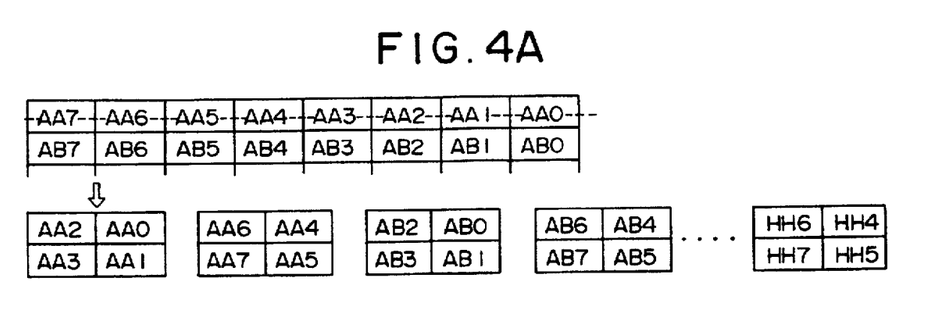
FIGS. 4A and 4B are diagrams showing how digital data is arranged in matrixes.

The first method for setting four pieces of data in the 2×2 matrix is shown in FIG. 4A. Every four consecutive pieces of data are extracted from the 512-byte digital data shown in FIG. 3 in the line direction (the horizontal direction in FIG. 3) in which eight pieces of data such as AA0–AA7 are aligned in a line. As shown in FIG. 4A, 2×2 matrixes [AA0, AA1, AA2, AA3], [AA4, AA5, AA6, AA7], ... are formed in this order. The first method is advantageous to detect an error in the same column direction (the vertical direction in FIG. 3) because the pieces of data of the digital data are extracted in the line direction. However, the first method has a difficulty in the detection of a burst error (an error in the horizontal direction in FIG. 3).

Figure 4B:
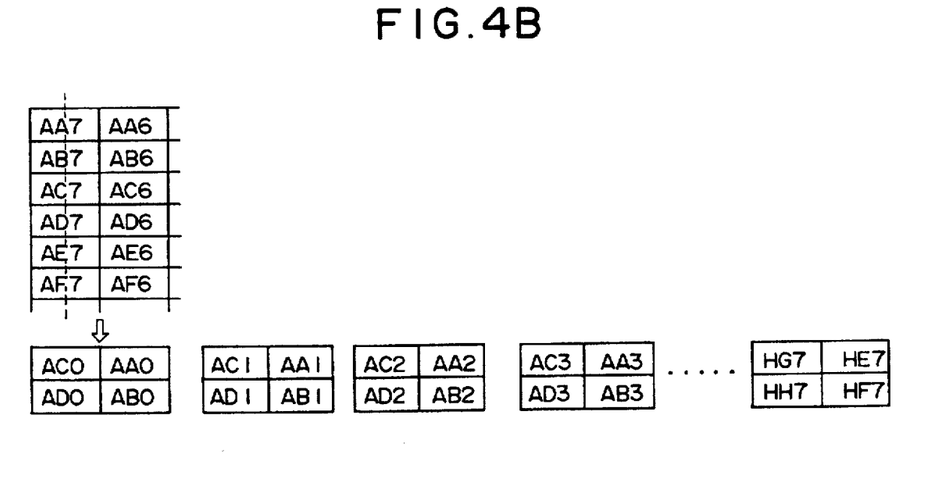

The second method for setting four pieces of data in the 2×2 matrix is shown in FIG. 4B. Every four consecutive pieces of data are extracted from the 512-byte digital data shown in FIG. 3 in the column direction in which pieces of data such as AA0, AB0, AC0, . . . are aligned in a column. As shown in FIG. 4B, 2×2 matrixes [AA0, AB0, AC0, AD0], [AA1, AB1, AC1, AD1] are formed in this order. The second method is advantageous to detect a burst error in the same line direction (the horizontal direction in FIG. 3) because the pieces of data of the digital data are extracted in the column direction. However, the second method has a difficulty in the detection of an error in the same line direction.

Figure 5:
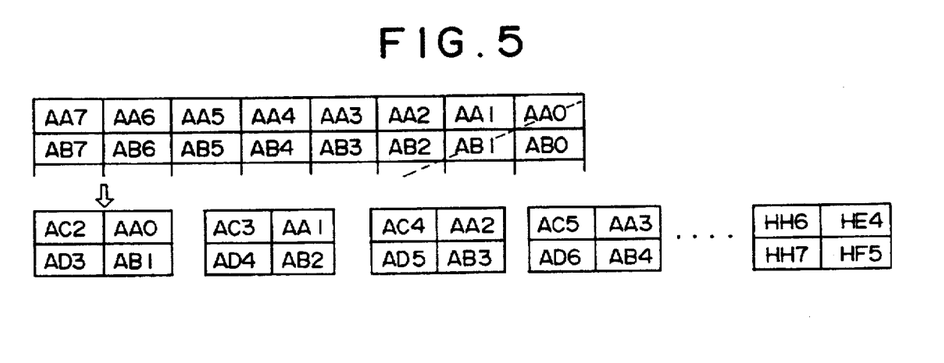
FIG. 5 is a diagram showing how digital data is arranged in matrixes.

The third method for setting four pieces of data in the 2×2 matrix is shown in FIG. 5. Every four consecutive pieces of data are obliquely extracted from the 512-byte digital data shown in FIG. 3. For example, matrixes [AA0, AB1, AC2, AD3], [AA1, AB2, AC3, AD4], . . . are formed in this order. The third method is advantageous to detect a burst error and an error in the same line direction because the pieces of data are obliquely extracted. However, it may be difficult to identify the address of the detected error.

The fourth method for setting four pieces of data in the 2×2 matrix is to extract every four pieces of data according to a rule applied to a particular area defined by the user. The user supposes occurrence of errors and defines a rule applied to a particular area of the arrangement of the digital data in order to effectively detect the supposed errors. The fourth method is flexible to the needs of the user, while it has a difficulty in identification of the address of the detected error.

Then, the matrixes thus formed are handled as pages, and the pieces of data of the matrixes are extended in the multiple dimensions.

Figure 6:
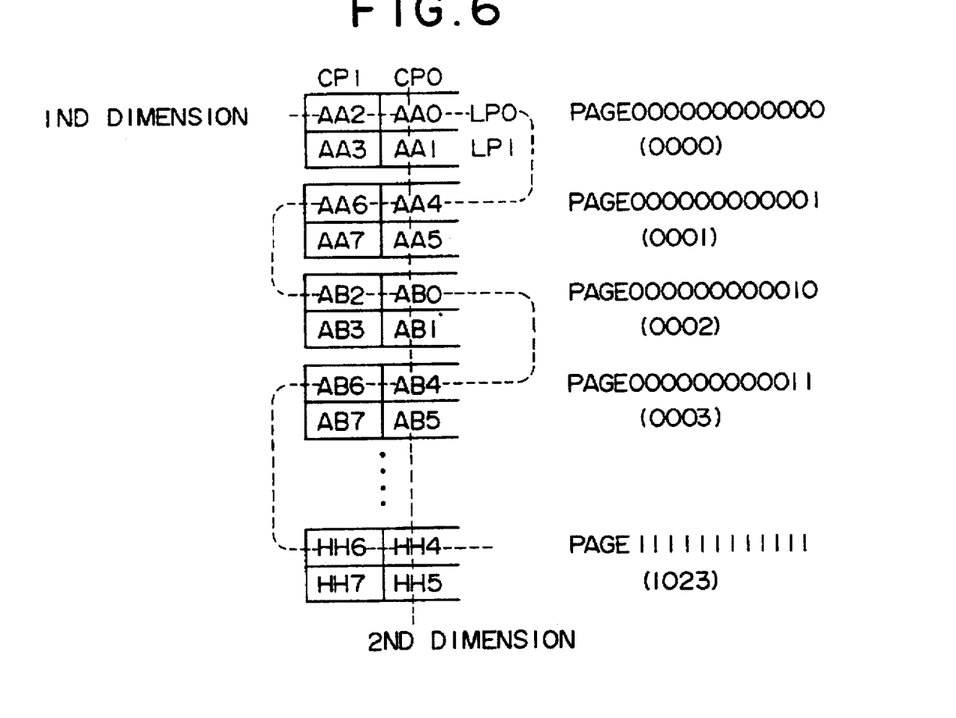
FIG. 6 is a diagram showing how data of the matrixes is arranged in multiple dimensions.

FIG. 6 shows that the matrixes formed by the first method are handled as pages, and the pieces of data of the matrixes thus formed are extended in the multiple dimensions. As shown in FIG. 6, the matrixes [AA0, AA1, AA2, AA3], [AA4, AA5, AA6, AA7], [AAS, AA9, AA10, AA11], . . . are handled as pages PAGE000000000000(0000), PAGE000000000001(0001), PAGE000000000010(0002), . . . , and the pieces of the parity data (one-bit parity data) of the respective dimensions are calculated (the numeral in each parenthesis is expressed in decimal notation).

Then, the parity data CP0 with respect to the first columns of the 2×2 matrixes (2048 bits) is calculated, and the parity data CP1 with respect to the second columns of the 2×2 matrixes (2048 bits) is calculated. The parity data CP0 and CP1 are the first-dimension data. Similarly, the parity data LP0 with respect to the first lines of the 2×2 matrixes (2048 bits) is calculated, and the parity data LP1 with respect to the second lines of the 2×2 matrixes (2048 bits) is calculated. The parity data LP0 and LP1 are the second-dimension data.

Figure 7:
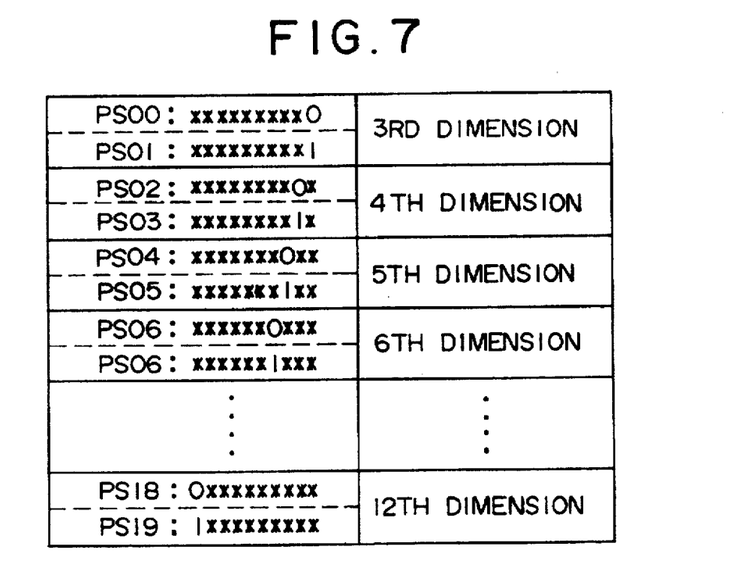
FIG. 7 is a diagram showing the relationship between the matrixes and pages.

Thereafter, as shown in FIG. 7, two pieces of parity data are calculated in each of the dimensions higher than the second dimension. For example, PS00 denotes the parity data for data of the pages having the first digit "0" in the page number expressed in binary notation, and PS01 denotes the parity data for data of the pages having the first digit "1" in the page number. The parity data PS00 and PS01 are the third-dimension data. In the above-mentioned manner, two pieces of the parity data related to each of the third to twelfth dimensions are calculated.

It will be noted that each of the dimensions is formed every two pages because the matrix has the 2×2 structure. In general, however, the number of pages contained in one dimension depends on the size of the matrix. It is possible to form each dimension every four or eight pages.

Figure 8:
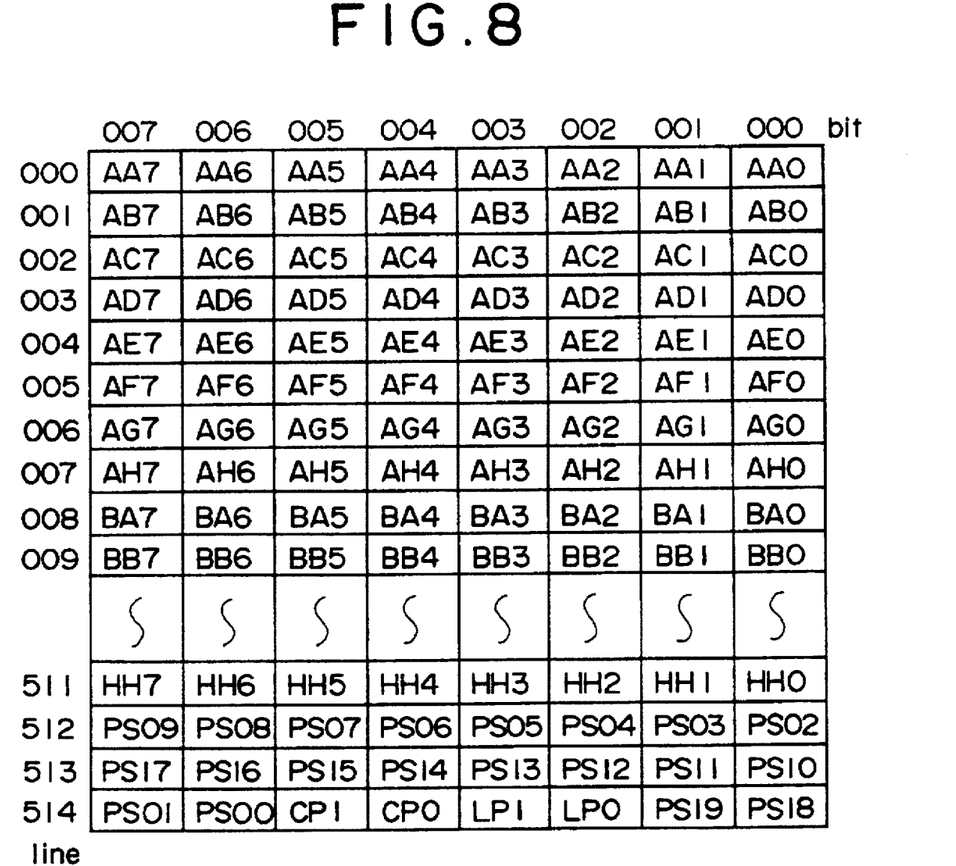
FIG. 8 is a diagram of digital data to which parity data is added.

The parity data produced in the above-mentioned manner is added to the data shown in FIG. 3. FIG. 8 shows the data with the parity data added thereto. The parity data CP0, CP1, LP0, LP1, PSO0, PS01, . . . , PS19 are arranged in lines 512 through 514 of the data. It is possible to arbitrarily arrange these pieces of the parity data in the lines 512 through 514. Further, two pieces of parity data (two bits of parity data) are paired such as (CPO, CP1), (LPO, LP1), (PS00, PS01, . . . , (PS18, PS19).

In the aforementioned memory system shown in FIG. 2, the CPU 102 or the controller LSI 101 adds the parity data produced in the above-mentioned manner to the data, and writes the data with the parity data added thereto into the flash memories 105-1 through 105-5. When the data is read from the flash memories 105-1 through 105-5, the data detection and correction process is performed by means of the parity data added to the data.

Figure 9:
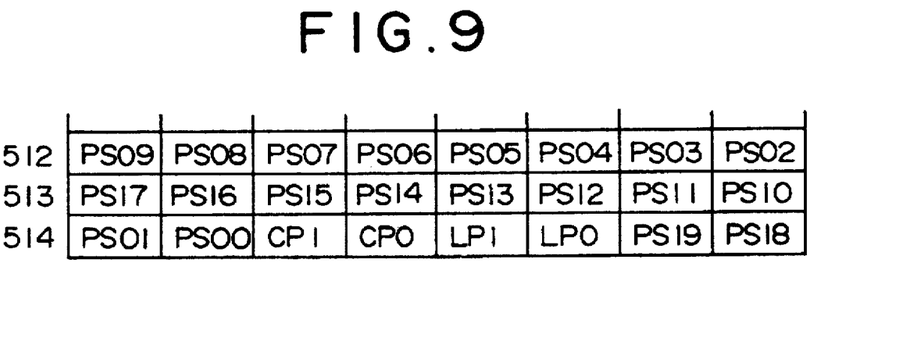
FIG. 9 is a diagram showing a parity error when an error occurs in bit BB6.

A description will now be given, with reference to FIG. 9, of a one-bit error detection and correction process. FIG. 9 shows the state of parity errors observed in the case where an error occurs at the bit BB6 shown in FIG. 8. In this case, an error occurs in one of each of the pairs of parity bits. In the case shown in FIG. 9, errors occur in the parity bits shown in dotted blocks. More specifically, the bit number of the bit BB6 is 110(6), and therefore an error occurs in one CP1 of the two pieces of the first-dimension parity data and an error occurs in one LP0 of the two pieces of the second-dimension parity data. The page address of the matrix having the bit BB6 is 0000010011(0019), and the first and second digits are "1". Hence, an error occurs in the third-dimension parity data PS01 and an error occurs in the fourth-dimension parity data PS03. Similarly, errors occur in the high dimension parity data.

As can be seen from FIG. 9, in the case where a one-bit error occurs, an error occurs in one of the two bits of each of all the parity pairs, and the contents of the errors directly indicate the error address and the error bit number. Hence, the value of the bit indicated as the one-bit error is inverted so that the one-bit error can be corrected.

The embodiment of the present invention being considered can detect an error of two bits or more but cannot correct the detected error in view of the algorithm employed in the present embodiment. Hence, such an error can be detected only according to the present embodiment.

When a two-bit error occurs, an error occurs in one of the two bits of each of all the parity pairs such as (CP0, CP1), (LP0, LP1), (PS00, PS01), (PS18, PS19) except for one parity pair. That is, a two-bit error can be detected with an accuracy of 100%.

When an odd error of three bits or more occurs, an error occurs in one of the two bits of each of all the parity pairs such as (CP0, CP1), (LP0, LP1), (PS00, PS01), (PS18, PS19) except for a plurality of parity pairs. Hence, odd errors of three bits or more can be detected with an accuracy of 100%.

When an even error of four bits or more occurs, errors concurrently occur in a plurality of matrixes among all the matrixes. Also, the state of occurrence of an even error of four bits or more may cause parity errors. Hence, in some cases, an even error of four bits or more may not be detected.

In order to improve the rate of detection of an even error of four bits or more, two of the aforementioned first through fourth methods are jointly used. Use of two of the first through fourth methods is effective in detection of an even error of four bits or more. In this case, different types of matrixes are formed with respect to a particular part (area) of the digital data. Hence, it is sufficient to have parity bits doubly in the particular area. It is not necessary to have bits data doubly with respect to the whole digital data.

For example, in the case where the 2×2 matrix is used when the first and second methods are jointly used, only five parity pairs (CP0, CP1), (LP0, LP1), (PS00, PS01), (PS02, PS03) and (PS04, PS05) are produced doubly. It is not necessary to doubly have parity pairs having the dimensions higher than those of the above five parity pairs because the parity pairs produced by the first method are the same as those produced by the second method.

When a one-bit error occurs in the parity data itself using the high-dimension matrixes, an error occurs in only one of the parity pairs, and is hence handled as a parity data error. In the case where an error of two bits or more occurs in the parity data itself, the user is authorized to determine what should be parity data errors.

The above-mentioned embodiment of the present invention detects and corrects errors by using the parity data derived from the high-dimension matrixes. It is possible to cooperate the parity data derived from the high-dimension matrixes with the check sum in order to improve the rate of detection of errors, particularly errors of four bits or more.

Figure 10:
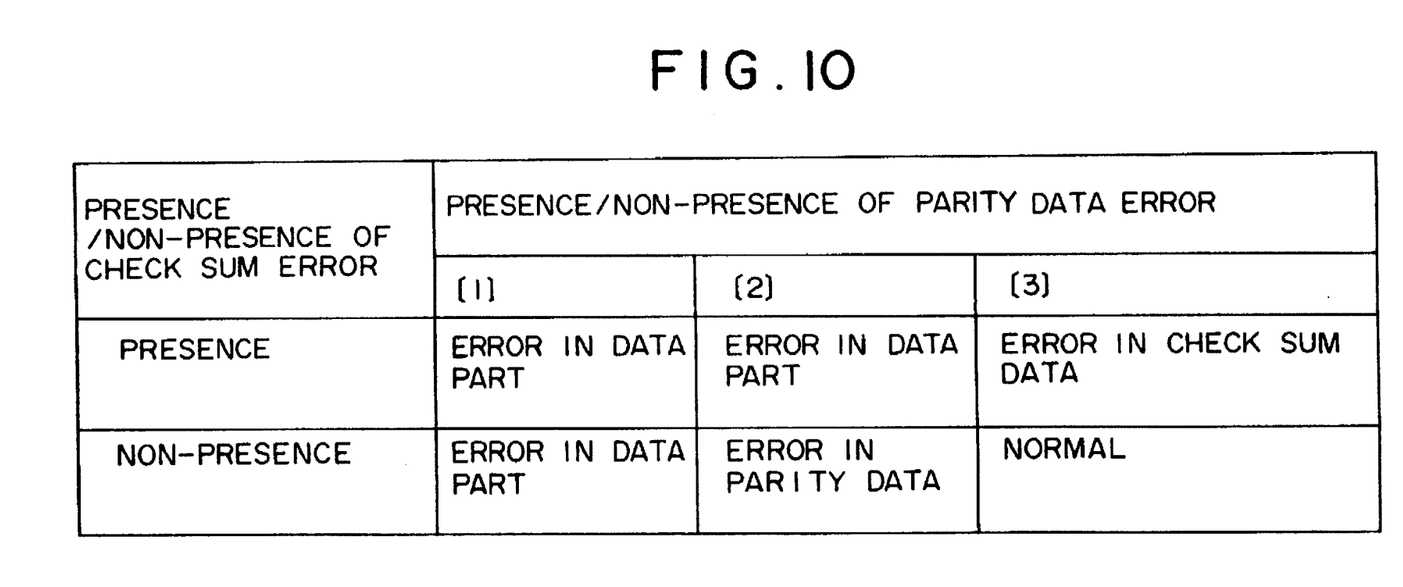
FIG. 10 is a diagram showing making error decisions used when error check sum is used.

FIG. 10 shows the conditions for determining whether or not errors have occurred. In FIG. 10, [1] shows the case where an error occurs in one of the two bits of each of all the parity pairs, [2] shows the case where an error occurs in one of the two bits of each of some parity pairs, and [3] shows the case where there is no error in all the parity pairs. As shown in FIG. 10, by using the parity data and the presence/nonpresence of check sum errors, it is possible to detect errors in the digital data, parity data, sum check data and to determine whether or not the digital data is normal.

Figure 11:
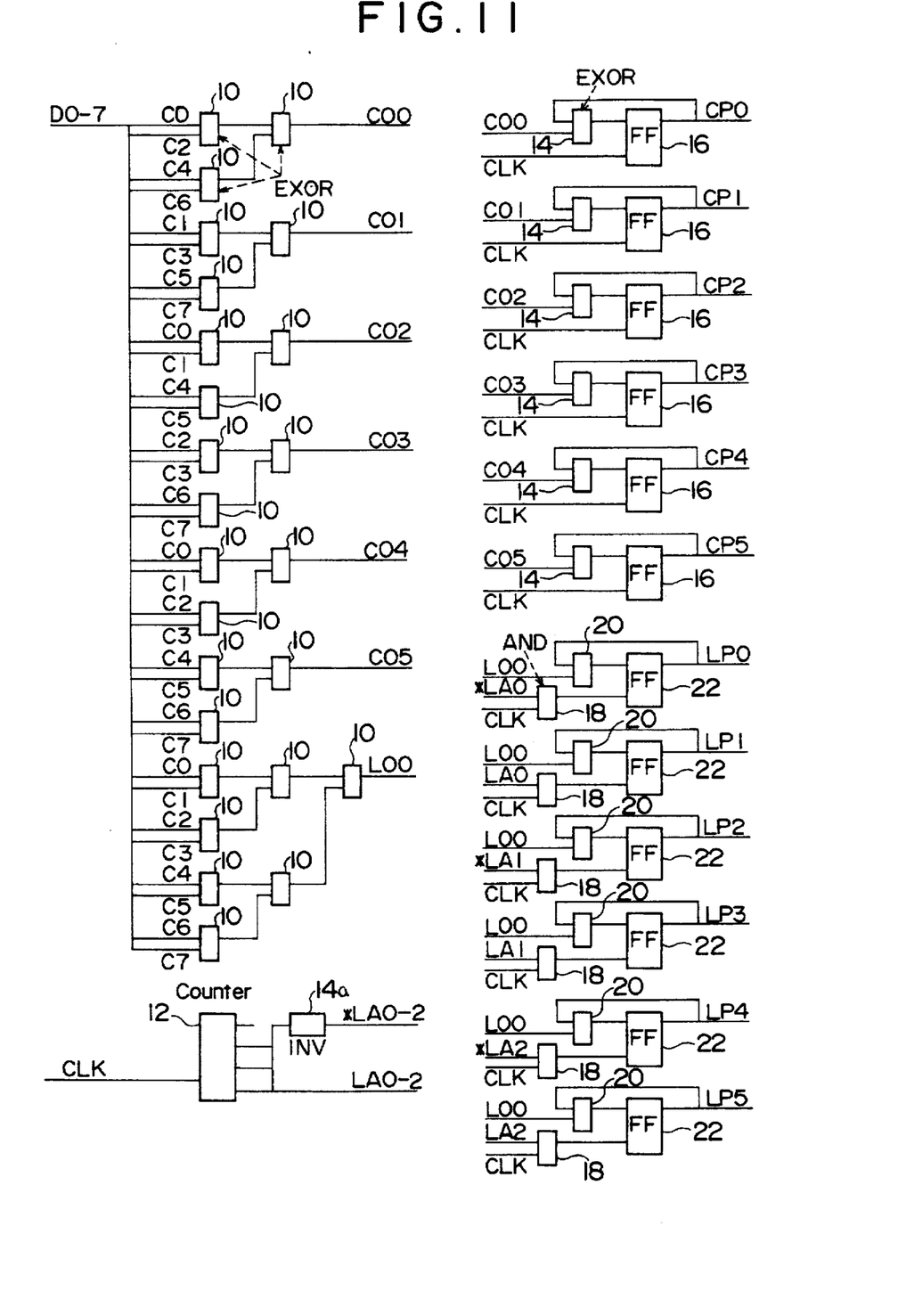
FIG. 11 is a block diagram of an ECC generator.

FIG. 11 is a block diagram of an ECC generator for use with 64-bit data (eight columns and lines). In the structure shown in FIG. 1, the ECC generator is implemented by software executed by the CPU 102 or the controller LSI 101. The structure shown in FIG. 11 is implemented by hardware. The ECC generator receives eight-bit digital data D0 through D7 and forms 2×2 matrixes. Then, the ECC generator arranges the data of the 2×2 matrixes into 6 dimensions, and produces a pair of parity bits such as (CP0, CP1) or (LP0, LP1) in each of the six dimensions.

The ECC generator has exclusive-OR gates (EXOR) 10, which receive the digital data D0 through D7, and generate signals CO0 through CO5, each of which signals is derived from four bits of the digital data. The digital data D0 through D7 are applied to the EXOR gates 10 in parallel via a bus, and symbols C0 through C7 denote respective one-bit lines of the bus. Further, the ECC generator generates a signal L00 from the digital data D0 through D7. The ECC generator has a four-bit counter 12 and an inverter 14a. The counter 12 performs the count operation in synchronism with a clock signal CLK. Three bits LA0, LA1 AND LA2 among the four-bit output signal of the counter 12 are inverted by the inverter 14a, which outputs inverted versions *LA0, *LA1 and *LA2.

Further, the ECC generator includes a circuit made up of EXOR gates 14 and flip-flops (FF) 16. The above circuit receives the signals CO0 through CO5 and the clock signal CLK, and produces pairs of parity bits (CP0, CP1), (CP2, CP3) and (CP4 and CP5) in the first, second and third dimensions, respectively. Furthermore, the ECC generator includes another circuit made up of AND gates 18, EXOR gates 20 and flip-flops 22. This circuit receives the signals L00, LA0 through LA3, *LA0 through *LA3 and the clock signal CLK, and produces pairs of parity bits (LP0, LP1), (LP2, LP3) and (LP4, LP5) in the fourth, fifth and sixth dimensions, respectively.

Figure 12A:
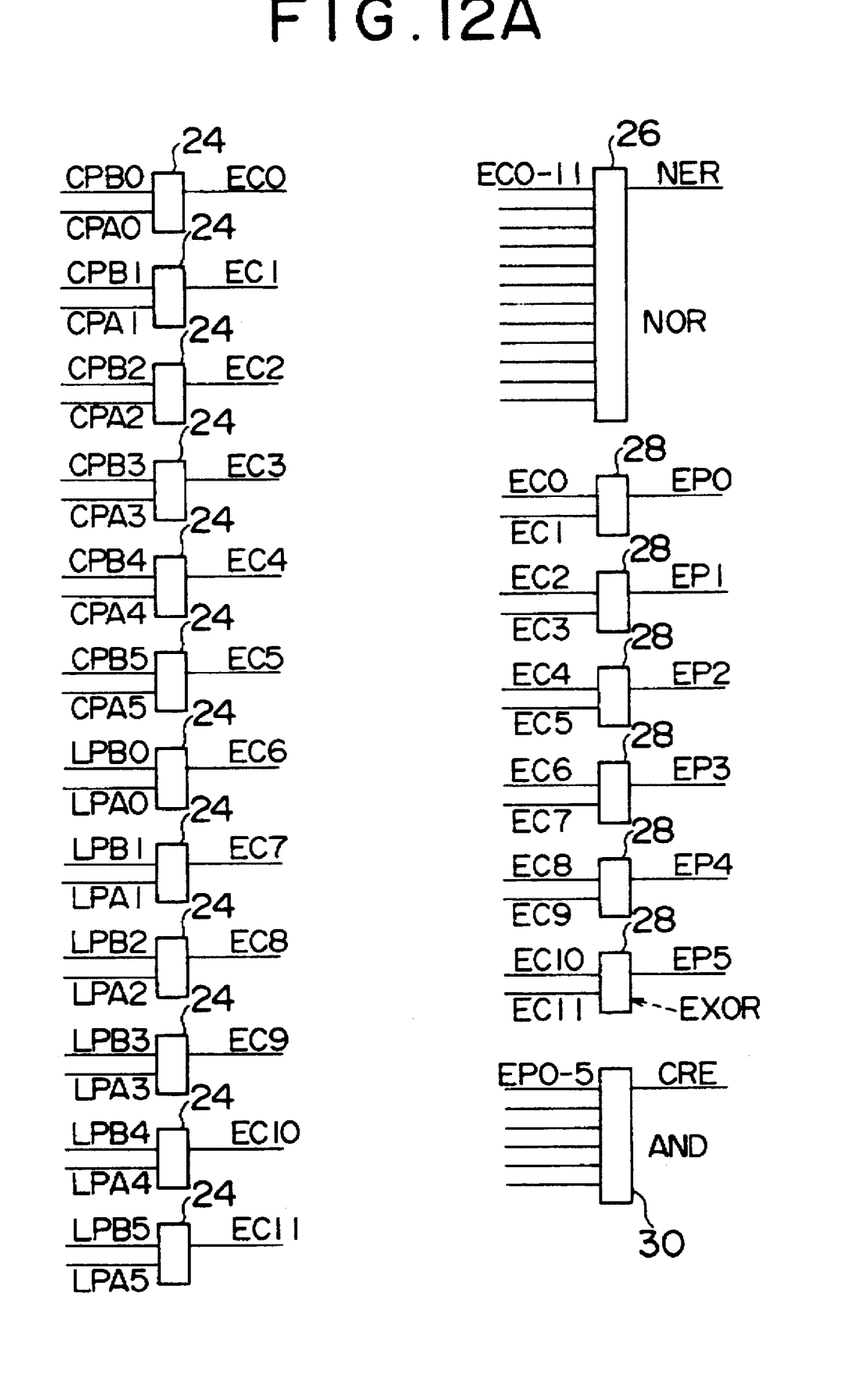
FIGS. 12A, 12B and 12C are diagrams of an ECC detector.
Figure 12B:
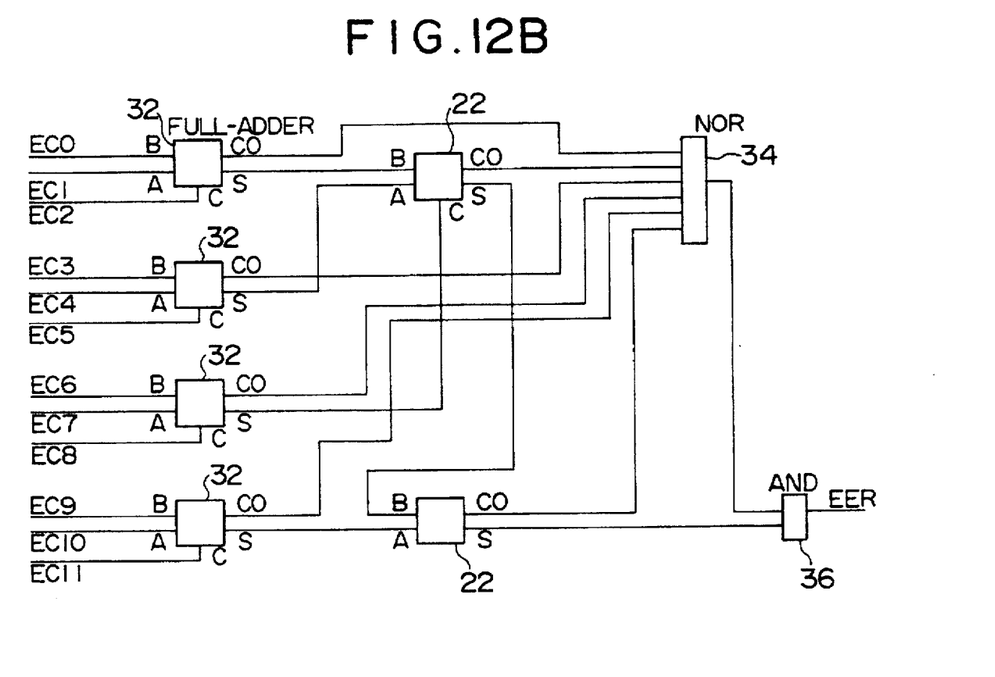
Figure 12C:
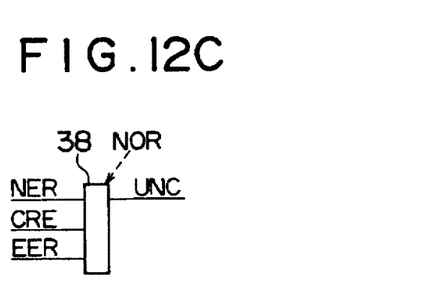

FIGS. 12A, 12B and 12C are block diagrams of an error detector. In the structure shown in FIG. 1, the error detector is implemented by software executed by the CPU 102 or the controller LSI 101. The structures shown in FIGS. 12A, 12B and 12C are implemented by hardware.

The error detector shown in FIG. 12A includes EXOR gates 24, which receive the parity bits CPA0 through CPA5 and LPA0 through LPA5 obtained this time, and parity bits CPB0 through CPB5 and LPB0 through LPB5 obtained last time. The EXOR gates 24 output signals EC0 through EC11. The error detector also includes a NOR gate 26, which receives the signals EC0 through EC11. The output signal NER of the NOR gate 26 indicates that there is no error. Further, the error detector includes EXOR gates 28, which receives the signals EC0 through EC11, and derives signals EP0 through EP5 therefrom. Furthermore, the error detector includes an AND gate 30, which receives the signals EP0 through EP5. The AND gate 30 outputs a correctable error signal CRE indicating the presence of a correctable error.

Further, the error detector includes a circuit shown in FIG. 12B, in which there are provided full adders 32, a NOR gate 34 and an AND gate 36. In FIG. 12B, symbols "A" and "B" denote inputs of the full adders 32, and symbol "C" denotes a carry input. Further, a symbol "S" denotes the output signal of each of the full adders 32, and a symbol "CO" denotes a carry signal. The circuit shown in FIG. 12B receives the signals EC0 through EC11, and outputs an ECC code error signal EER.

Further, the error detector has a NOR gate 38 shown in FIG. 12C. The NOR gate 38 receives the signals NER, CRE and EER, and outputs an uncorrectable error signal UNC.

According to the present invention, the digital data is arranged in the multiple dimensions, preferably dimensions equal to or higher than the fourth dimension, and the error detection and correction data is produced in each of the multiple dimensions. With the above structure, it becomes possible to definitely detect and correct errors contained in the digital data by a simple algorithm and a small amount of data to be added to the digital data. Further, the present invention is very effective to all types of errors such as random errors, burst errors and byte errors.

The present invention is not limited to the specifically disclosed embodiments, and variations and modifications may be made without departing from the scope of the present invention.

What is claimed is:

1. A device comprising:
   a memory; and
   control means for controlling a data write and read operation on the memory;
   said control means comprising:
   first means for arranging bits of digital data to be written into the memory in matrixes having a predetermined size so that arranged data is obtained for each of a plurality of dimensions equal to or higher than a fourth dimension;
   second means for producing first error detection and correction data for each of sets of bits located in an identical row and identical column of all the matrixes and producing second error detection and correction data for all bits of matrixes selected from among all the matrixes in accordance with a predetermined rule; and
   third means for detecting and correcting an error which may be contained in the digital data by using said first and second error detection and correction data.

2. The device as claimed in claim 1, wherein said third means comprises means for detecting and correcting an error which may be contained in the digital data by using said first and second error detection and correction data.

3. The device as claimed in claim 1, wherein said third means comprises means for detecting and correcting a one-bit error which may be contained in the digital data by using said first and second error detection and correction data.

4. The device as claimed in claim 1, wherein said third means comprises means for detecting and correcting an odd error of a plurality of bits which may be contained in the digital data by using said first and second error detection and correction data.

5. The device as claimed in claim 1, wherein said memory comprises a flash memory.

6. The device as claimed in claim 1, wherein said third means comprises means for detecting and correcting an even error of a plurality of bits which may be contained in the digital data by using said first and second error detection and correction data.

7. The device as claimed in claim 6, wherein said third means comprises means for detecting and correcting an error which may be contained in the digital data by using said first and second error detection and correction data and check sum data.

8. A method of detecting and correcting an error that may be contained in a series of digital data, said method comprising:

(a) arranging the series of digital data in a plurality of matrices each having M rows and N columns where M and N are respectively integers;

(b) generating M bits of a first error detection and correction code, where for each integer i between 1 and M an i-th bit of the first error detection and correction code is generated by all bits in the i-th row of all of the matrices;

(c) generating N bits of a second error detection and correction code, where for each integer j between 1 and N a j-th bit of the second error detection and correction code is generated by all bits in the j-th column of all of the matrices;

(d) grouping the matrices into L groups where L is an integer; and (e) generating L bits of a third error detection and correction code, where for each integer k between 1 and L a k-th bit of the third error detection and correction code is generated by all bits in the k-th group.

9. The method as claimed in claim 8, wherein said arranging in (a) arranges the series of digital data into the plurality of matrices indicated by an address of E bits where E is an integer; and wherein said grouping in (d) groups the matrices into the L groups according to logical values in t-th bits of the address where t is an integer equal to at least one numeral between 1 and E.

10. A method of detecting and correcting an error that may be contained in a series of digital data, said method comprising:

(a) arranging the series of the digital data in a plurality of matrices each having M rows and N columns where M and N are respectively integers, the plurality of matrices being indicated by an address of E bits where E is an integer; and (b) grouping the matrices into L groups according to logical values in t-th bits of the address where L is an integer and t is an integer equal to at least one numeral between 1 and E; and (c) generating L bits of an error detection and correction code, where for each integer k between 1 and L a k-th bit of the error detection and correction code is generated by all bits in the k-th group.

11. The method as claimed in claim 10, wherein said generating in (c) generates E×H bits of the error detection and correction code, where H is a number of logical values contained in the address.

12. The method as claimed in claim 10, wherein the address of the matrices in the groups produced by said grouping in (b) has identical logical values in the t-th bits.

13. A device to detect and correct an error that may be contained in a series of digital data, said device comprising:

a first part arranging the series of digital data in a plurality of matrices each having M rows and N columns where M and N are respectively integers;

a second part generating M bits of a first error detection and correction code, where for each integer i between 1 and M an i-th bit of the first error detection and correction code is generated by all bits in the i-th row of all of the matrices;

a third part generating N bits of a second error detection and correction code, where for each integer j between 1 and N a j-th bit of the second error detection and correction code is generated by all bits in the j-th column of all of the matrices;

a fourth part grouping the matrices into L groups where L is an integer, and a fifth part generating L bits of a third error detection and correction code, where for each integer k between 1 and L a k-th bit of the third error detection and correction code is generated by all bits in the k-th group.

14. The device as claimed in claim 13, wherein said first part arranges the series of digital data into the plurality of matrices indicated by an address of E bits where E is an integer; and wherein said fourth part groups the matrices into the L groups according to logical values in t-th bits of the address where t is an integer equal to at least one numeral between 1 and E.

15. A device to detect and correct an error that may be contained in a series of digital data, said device comprising:

a first part arranging the series of digital data in a plurality of matrices each having M rows and N columns where M and N are respectively integers, the plurality of matrices being indicated by an address of E bits where E is an integer;

a second part grouping the matrices into L groups according to logical values in t-th bits of the address where L is an integer and t is an integer equal to at least one numeral between 1 and E; and a third part generating L bits of an error detection and correction code, where for each integer k between 1 and L a k-th bit of the error detection and correction code is generated by all bits in the k-th group.

16. The device as claimed in claim 15, wherein said third part generates E×H bits of the error detection and correction code, where H is a number of logical values contained in the address.

17. The method as claimed in claim 15, wherein the address of the matrices in the groups produced by said second part has identical logical values in the t-th bits.

* * * * *